US010249479B2

(12) United States Patent
Aubuchon et al.

(10) Patent No.: US 10,249,479 B2
(45) Date of Patent: Apr. 2, 2019

(54) MAGNET CONFIGURATIONS FOR RADIAL UNIFORMITY TUNING OF ICP PLASMAS

(71) Applicant: Applied Materials, Inc., Santa Clara, CA (US)

(72) Inventors: Joseph F. Aubuchon, San Jose, CA (US); Tza-Jing Gung, San Jose, CA (US); Travis Lee Koh, Sunnyvale, CA (US); Nattaworn Boss Nunta, Standford, CA (US); Sheng-Chin Kung, Milpitas, CA (US); Steven Lane, Porterville, CA (US); Kartik Ramaswamy, San Jose, CA (US); Yang Yang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 148 days.

(21) Appl. No.: 14/985,688

(22) Filed: Dec. 31, 2015

(65) Prior Publication Data

US 2016/0225590 A1 Aug. 4, 2016

Related U.S. Application Data

(60) Provisional application No. 62/110,041, filed on Jan. 30, 2015.

(51) Int. Cl.
*H01J 37/32* (2006.01)
(52) U.S. Cl.
CPC ..... *H01J 37/32669* (2013.01); *H01J 37/3211* (2013.01)

(58) Field of Classification Search
None
See application file for complete search history.

(56) References Cited

U.S. PATENT DOCUMENTS

| | | | | | |
|---|---|---|---|---|---|
| 4,745,337 | A | * | 5/1988 | Pichot | H01J 37/32623 118/723 AN |
| 5,216,329 | A | * | 6/1993 | Pelleteir | H01J 37/3222 204/298.37 |
| 5,430,355 | A | * | 7/1995 | Paranjpe | H01J 37/321 313/231.31 |
| 5,587,038 | A | * | 12/1996 | Cecchi | H01J 37/321 118/723 I |
| 6,310,577 | B1 | * | 10/2001 | Ra | H01J 37/321 156/345.49 |
| 6,803,585 | B2 | * | 10/2004 | Glukhoy | H01J 37/08 204/192.15 |
| 8,617,351 | B2 | * | 12/2013 | Hoffman | H01J 37/32091 156/345.46 |
| 8,771,538 | B2 | * | 7/2014 | Lubomirsky | H01J 37/32357 156/345.24 |
| 8,871,064 | B2 | * | 10/2014 | Gung | C23C 14/046 204/192.1 |
| 9,123,512 | B2 | * | 9/2015 | Rostoker | G21B 1/052 |
| 9,269,546 | B2 | * | 2/2016 | Wu | H01J 37/3233 |

(Continued)

*Primary Examiner* — Dion Ferguson
*Assistant Examiner* — Srinivas Sathiraju
(74) *Attorney, Agent, or Firm* — Patterson + Sheridan, LLP

(57) ABSTRACT

Embodiments described herein generally relate to plasma process apparatus. In one embodiment, the plasma process apparatus includes a plasma source assembly. The plasma source assembly may include a first coil, a second coil surrounding the first coil, and a magnetic device disposed outside the first and inside the second coil. The magnet enables additional tuning which improves uniformity control of the processes on the substrate.

17 Claims, 2 Drawing Sheets

(56) References Cited

U.S. PATENT DOCUMENTS

| | | | |
|---|---|---|---|
| 9,491,841 B2* | 11/2016 | Jevtic | H05H 1/46 |
| 9,653,264 B2* | 5/2017 | Nagorny | H01J 37/321 |
| 9,844,126 B2* | 12/2017 | Ikeda | H01J 37/3211 |
| 2003/0201722 A1* | 10/2003 | Appleyard | H01J 37/3211 |
| | | | 315/111.21 |
| 2005/0016957 A1* | 1/2005 | Kodaira | B82Y 25/00 |
| | | | 216/67 |
| 2009/0189083 A1* | 7/2009 | Godyak | H01J 27/18 |
| | | | 250/423 R |
| 2009/0220865 A1 | 9/2009 | Ouye | |
| 2010/0025384 A1* | 2/2010 | Todorow | H01J 37/32091 |
| | | | 219/121.54 |
| 2010/0044340 A1* | 2/2010 | Kodaira | B82Y 10/00 |
| | | | 216/22 |
| 2010/0301008 A1* | 12/2010 | Shinde | C23F 4/00 |
| | | | 216/22 |
| 2011/0278260 A1* | 11/2011 | Lai | C23C 16/45565 |
| | | | 216/68 |
| 2011/0308544 A1* | 12/2011 | Osada | B82Y 25/00 |
| | | | 134/1.1 |
| 2012/0298303 A1* | 11/2012 | Ikeda | H01J 37/3211 |
| | | | 156/345.48 |
| 2013/0098872 A1* | 4/2013 | Dorf | H01J 37/3233 |
| | | | 216/67 |
| 2013/0105086 A1* | 5/2013 | Banna | H05H 1/46 |
| | | | 156/345.38 |
| 2013/0278141 A1* | 10/2013 | Dorf | H01J 37/32082 |
| | | | 315/111.41 |
| 2013/0278142 A1* | 10/2013 | Dorf | H01J 37/32183 |
| | | | 315/111.41 |
| 2014/0020838 A1* | 1/2014 | Kenney | H01J 37/04 |
| | | | 156/345.48 |
| 2014/0020839 A1* | 1/2014 | Kenney | H01J 37/04 |
| | | | 156/345.48 |
| 2014/0262767 A1* | 9/2014 | Subramani | C23C 14/3414 |
| | | | 204/298.13 |
| 2015/0068682 A1* | 3/2015 | Banna | H01J 37/32119 |
| | | | 156/345.33 |
| 2015/0087157 A1* | 3/2015 | Aubuchon | H01L 21/3065 |
| | | | 438/732 |
| 2015/0348755 A1* | 12/2015 | Han | H01J 37/3244 |
| | | | 118/723 IR |
| 2015/0371824 A1* | 12/2015 | Lane | H01J 37/32165 |
| | | | 216/67 |
| 2016/0225590 A1* | 8/2016 | Aubuchon | H01J 37/32669 |
| 2016/0372307 A1* | 12/2016 | Yang | H01J 37/32715 |

* cited by examiner

MAGNET CONFIGURATIONS FOR RADIAL UNIFORMITY TUNING OF ICP PLASMAS

CROSS-REFERENCE TO RELATED APPLICATIONS

This application claims priority to U.S. Provisional Patent Application Ser. No. 62/110,041, filed on Jan. 30, 2015, which herein is incorporated by reference.

BACKGROUND

Field

Embodiments described herein generally relate to plasma process apparatus.

Description of the Related Art

Inductively coupled plasma (ICP) process chambers generally form plasmas by inducing ionization in a process gas disposed within the process chamber via one or more inductive coils disposed outside of the process chamber. The inductive coils may be disposed externally and separated electrically from the process chamber by, for example, a dielectric lid. When radio frequency (RF) current is fed to the inductive coils via an RF feed structure from an RF power source, an inductively coupled plasma can be formed inside the process chamber from a magnetic field generated by the inductive coils.

In some chamber designs, the chamber may be configured to concentric inner and outer inductive coils. Due to constructive interference of the magnetic fields induced by the coils, the additive field properties between the inner and outer coils can result in non-uniformities in the distribution of the plasma formed at the substrate level away from the coils. For example, due to etch rate non-uniformity caused by the non-uniform distribution in plasma, a substrate etched by such a plasma may result in a non-uniform etch pattern on the substrate, such as an M-shaped etch pattern, e.g., a center low and edge low etch surface with peaks between the center and edge. Adjusting the power ratio between the inner and outer coils to control the severity of the non-uniformity is not sufficient to completely eliminate the non-uniformity.

Therefore, an improved plasma process apparatus is needed to better control plasma processing non-uniformity.

SUMMARY

Embodiments described herein generally relate to plasma process apparatus. In one embodiment, a plasma processing apparatus includes a plasma processing apparatus having a plasma source assembly. The plasma source assembly includes a first coil and a second coil surrounding the first coil. The plasma source assembly further includes a magnetic device disposed outside the first coil and inside the second coil.

In another embodiment, a plasma processing apparatus includes a process chamber, and the process chamber includes a chamber body, a chamber lid, and a plasma source assembly disposed over the process chamber. The plasma source assembly includes a first coil and a second coil surrounding the first coil. A magnetic device is disposed in an annular space defined between the first and second coils.

In another embodiment, a method includes delivering a process gas into a processing volume of a process chamber having a chamber lid and a plasma source assembly disposed over the chamber lid. The plasma source assembly includes at least two coils and a magnetic device disposed between the two coils, and the magnetic device is spaced a distance away from the chamber lid. The method further includes inductively coupling an RF power to the process gas from an RF power source via the at least two coils, forming a plasma in the processing volume from the process gas using the RF power, creating a magnetic field in the processing volume using the magnetic device, and adjusting a strength of the magnetic field.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to plasma process apparatus. In one embodiment, the plasma process apparatus includes a plasma source assembly. The plasma source assembly may include a first coil, a second coil surrounding the first coil and a magnetic device disposed between the first and second coils. The magnetic device enables additional tuning which improves uniformity control of the processes on the substrate.

Figure 1:
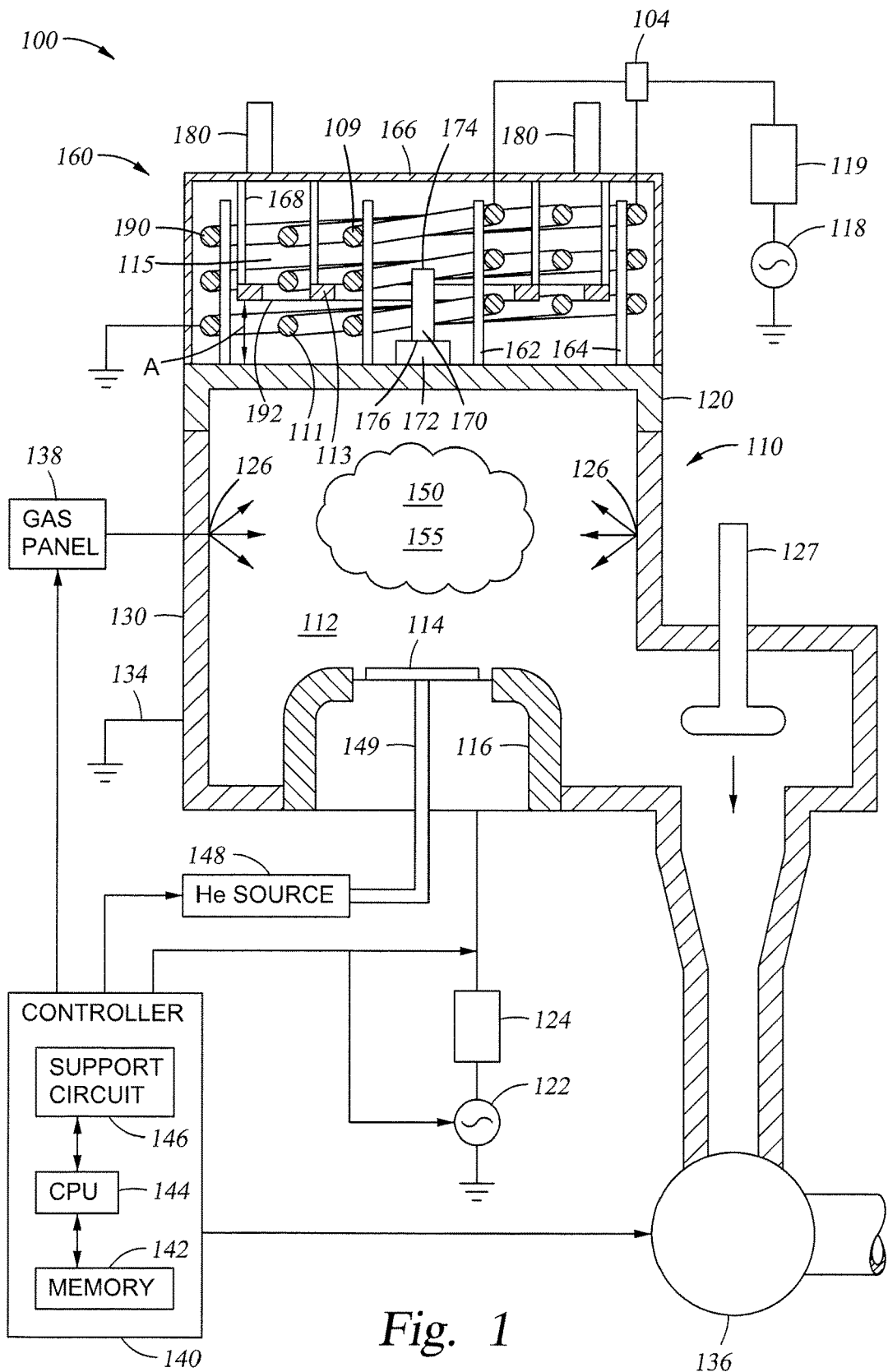
FIG. 1 is a schematic cross sectional side view of a plasma process apparatus, according to one embodiment.

FIG. 1 is a schematic cross sectional side view of a plasma process apparatus 100, according to one embodiment. The plasma process apparatus may be an inductively coupled plasma chamber and may be utilized alone or, as a processing module of an integrated semiconductor substrate processing system, or cluster tool, such as CENTURA® integrated semiconductor substrate processing system, available from Applied Materials, Inc. of Santa Clara, Calif. Examples of suitable plasma chambers that may advantageously benefit from modification in accordance with embodiments of the present disclosure include inductively coupled plasma etch chambers (such as the DPS®, DPS® II, DPS® AE, DPS® G3 poly etcher, DPS® G5, C3, or the like) also available from Applied Materials, Inc. The above listing of semiconductor equipment is illustrative only, and other etch and non-etch chambers (such as plasma enhanced chemical vapor deposition (PECVD) chambers, or other semiconductor processing equipment, including processing equipment from other manufacturers) may also be suitably modified in accordance with the present disclosure.

As shown in FIG. 1, the plasma process apparatus 100 may be a plasma process chamber 110 including a chamber body 130 and a chamber lid 120 that together define a processing volume 112. The plasma process chamber 110 may further include a substrate support 116 disposed in the processing volume 112, a plasma source assembly 160 disposed over the chamber lid 120, and a controller 140. The chamber body 130 may be coupled to an electrical ground 134. In some embodiments, the substrate support 116 may be coupled, through a matching network 124, to a biasing power source 122. The power source 122 may be a source having a power density of up to 3.18 W/cm$^2$ at a frequency of approximately 13.56 MHz that is capable of producing either continuous or pulsed power. In other embodiments, the power source 122 may be a DC or pulsed DC source.

The chamber lid 120 may be made of a dielectric material. In some embodiments, the chamber lid 120 may be substantially flat. In other embodiments, the chamber lid 120 may be a dome or another suitable shape. The plasma source assembly 160 may be disposed over the chamber lid 120. The plasma source assembly 160 may include at least two RF coils, such as a first coil 109 and a second coil 111 surrounding the first coil 109. The first coil 109 and the second coil 111 may be concentric. An annular space 115 is defined between the first coil 109 and the second coil 111. There may be a third coil 190 surrounding the first coil 109 and the second coil 111, and the third coil 190 may be surround and/or concentric with one of the first coil 109 and the second coil 111. The first coil 109 may be supported by two or more supports 162 and the second coil 111 may be supported by two or more supports 164. Supports 162, 164 may be made of a dielectric material and may be disposed on the chamber lid 120. The relative position, ratio of diameters of each coil, and/or the number of turns in each coil can each be adjusted to control, for example, the profile or density of a plasma formed inside the processing volume 112. Each coil 109, 111 may be coupled, through a matching network 119, to an RF power source 118. The RF power source 118 may be capable of producing up to 13 W/cm$^2$ at a tunable frequency in a range from about 50 kHz to about 13.56 MHz. In some embodiments, a power divider 104, such as a dividing capacitor, may be provided to control the relative quantity of RF power provided by the RF power source 118. The power divider 104 may be disposed in the line coupling the first coil 109 and the second coil 111 to the RF power source 118 for controlling the amount of RF power provided to each coil. In other embodiments, each coil may be separately powered by a different RF source.

During operation, a substrate 114 may be placed on the substrate support 116 and process gases may be supplied from a gas panel 138 through entry ports 126 to form a gas mixture 150 within the processing volume 112. The gas mixture 150 may be transformed into a plasma 155 in the processing volume 112 by coupling RF power to the gas mixture from the first and second coils 109, 111 that are energized by the RF power source 118. The pressure within the processing volume 112 may be controlled using a throttle valve 127 and a vacuum pump 136. The temperature of the chamber body 130 may be controlled using liquid-containing conduits (not shown) that run through the chamber body 130. The temperature of the substrate 114 may be controlled by stabilizing a temperature of the substrate support 116. In one embodiment, helium gas from a gas source 148 may be provided via a gas conduit 149 to channels defined between the backside of the substrate 114 and grooves (not shown) disposed in the surface of the substrate support 116. The helium gas may be used to facilitate heat transfer between the substrate support 116 and the substrate 114.

The controller 140 may include a central processing unit (CPU) 144, a memory 142, and support circuits 146 for CPU 144 and may facilitate control of the components of the plasma process chamber 110 and, as such, of methods discussed herein. The controller 140 may be one of any form of general-purpose computer processor that can be used in an industrial setting for controlling various chambers and sub-processors. The memory 142, such as computer readable-medium, of the controller 140 may be one or more of readily available memory, such as random access memory (RAM), read only memory (ROM), floppy disk, hard disk, or any other form of digital storage, local or remote. The support circuits 146 are coupled to the CPU 144 for supporting the CPU 144 in any conventional manner. The circuits 146 may include cache, power supplies, clock circuits, input/output circuitry and sub-systems. The methods described herein may be stored in the memory 142 as software routine that may be executed or invoked to control the operation of the plasma process chamber 110 in the manner described herein.

A magnetic device 113 may be placed in the annular space 115 between the at least two coils, such as between the first coil 109 and the second coil 111. For example, the magnetic device 113 may be placed outside the first coil 109 and inside the second coil 111 in a radial direction, in order to increase radial tunability by affecting plasma generation and/or diffusion using magnetic fields. The magnetic device 113 may be one or more permanent magnets, electromagnets, electro-permanent magnets, or other suitable magnets. The magnetic device 113 may withstand a temperature up to about 120 degrees Celsius. The magnetic fields produced by the magnetic device 113 may be perpendicular to the induced electric fields in the plasma from the coils 109, 111, resulting in no plasma enhancement. However, the magnetic fields may affect ion diffusion directions, such that the ions experience Lorentz force resulting in longer path to the substrate and wider spread before reaching the substrate. The effect of having the magnetic device 113 disposed between the coils 109, 111 may be similar to having an increased distance between the chamber lid 120 and the substrate, but more localized to high power deposition area, so the ion spread is still on the substrate and does not result in etch rate drop. The magnetic device 113 also increases the tuning range, such as higher center-high profiles and lower center-low profiles, as well as flatter profiles.

The magnetic device 113 may be supported by one or more supports 168. The one or more supports 168 may be coupled to a cap 166, or alternatively, be coupled to an actuator (not shown). The actuator may be utilized to control the spacing (shown as distance A) of the magnetic device 113 above the lid 120. The coils 109, 111 and the magnetic device 113 may be enclosed by the cap 166. Supports 162, 164 may be suspended from the cap 166 or extended inward from the side wall of the cap 166. A plurality of magnets 180 may be disposed on the cap 166. The magnetic device 113 may define a plane that is a distance A away from the chamber lid 120. The plane defined by the magnetic device 113 may be substantially parallel to the chamber lid 120 or may be angled with respect to the chamber lid 120. The magnetic device 113 may be non-planar, such that a first portion of the magnetic device 113 is a first distance away from the chamber lid 120, and a second portion of the magnetic device 113 is a second distance away from the chamber lid 120, wherein the first distance is not the same as the second distance. In some embodiments, the magnetic device 113 may be concentric with the coils 109, 111. In other embodiments, the magnetic device 113 may not be concentric with the coils 109, 111 (i.e., the magnetic device 113 may have a center that is offset from the center of the coils 109, 111).

A magnet 170 may be disposed at the center of the concentric coils 109, 111, and the magnet 170 may be supported by a dielectric support 172 disposed on the chamber lid 120. In one embodiment, the magnet 170 is suspended from the cap 166. The magnet 170 may be a permanent magnet, electromagnet, electro-permanent magnet, or any suitable magnet. The magnet 170 may be the same type of the magnet as the magnetic device 113. The magnet 170 may be cylindrical or any suitable shape. In one embodiment, the magnetic 170 is cylindrical having a 2 in diameter. The magnet 170 may have an upper pole 174 and a lower pole 176. In one embodiment, the upper pole 174 is the north pole and the lower pole 176 is the south pole. In another embodiment, the upper pole 174 is the south pole and the lower pole 176 is the north pole. The magnet 170 may redirect some magnetic flux from the magnetic device 113 towards the center of the processing volume 112 and may form a strong magnetic field right below the center of the chamber lid 120. The strong magnetic field may restrict diffusion of plasma to the center location that is right below the chamber lid 120. The plasma is directed down towards the center of the substrate 114 by the strong magnetic field, so ion-flux is spread out from a location on the substrate experiencing power deposition resulting in lower deposition rate near the location on the substrate and improved uniformity relative to a M-shaped deposition profile. The magnetic device 113 may be used with or without the magnet 170.

Figure 2A:
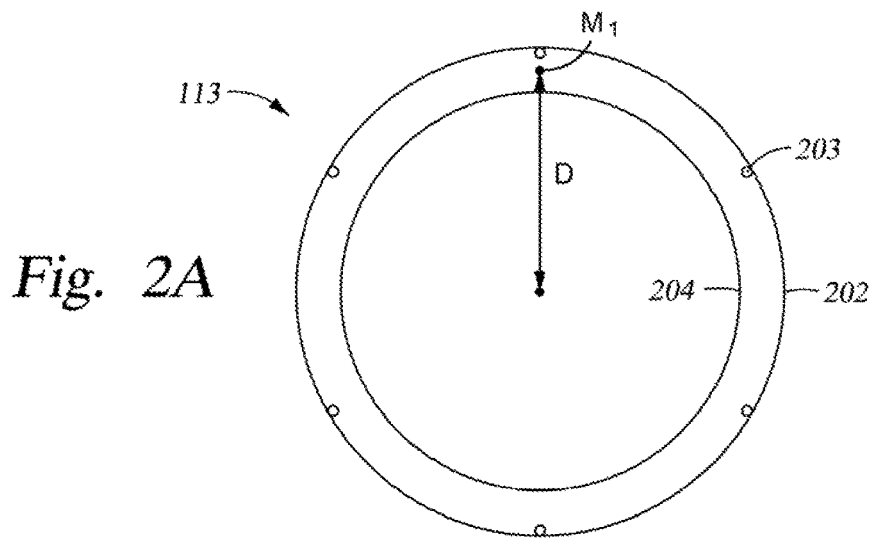
FIGS. 2A-2C are plan views of a magnetic device, according to various embodiments.
Figure 2B:
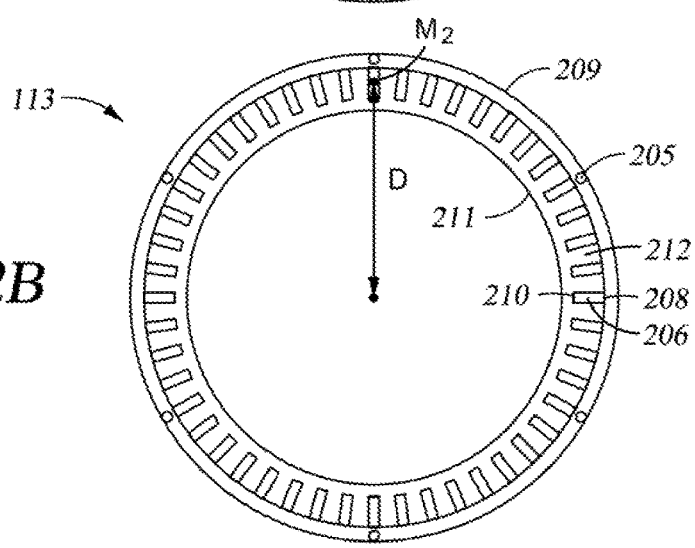
Figure 2C:
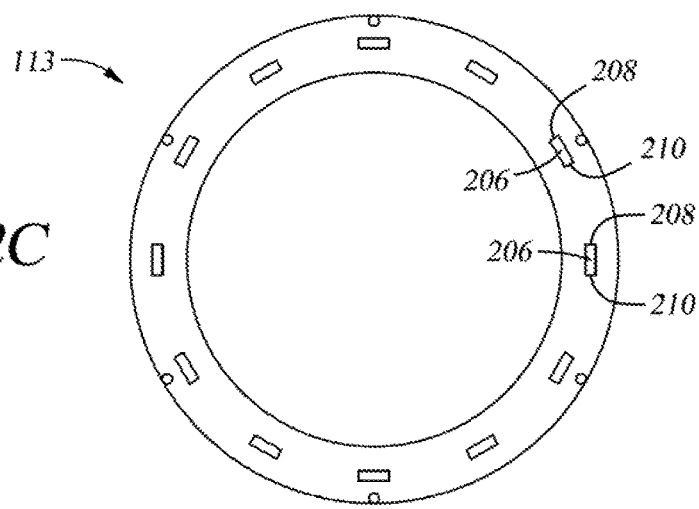

FIGS. 2A-2C are plan views of the magnetic device 113 according to various embodiments. As shown in FIG. 2A, the magnetic device 113 may be a single piece of material, such as a single piece of permanent magnet, electromagnet, electro-permanent magnet, or any other suitable magnet. In one embodiment, the magnetic device 113 is a single piece of rare earth magnet. The magnetic device 113 may be made of a magnetic material that can operate at a temperature up to 180 degrees Celsius without losing magnetization. The magnetic device 113 may be annular and may be concentric with the first coil 109 and the second coil 111. The magnetic device 113 may have an outer edge 202 and an inner edge 204. The magnetic device 113 may be placed radially between the first coil 109 and the second coil 111. In some embodiments, there are more than two concentric coils, and the magnetic device 113 may be disposed radially between any or each two adjacent coils. In one embodiment, there is a first coil, second coil surrounding the first coil, and a third coil surrounding the second and first coils. A first magnetic device 113 is disposed outside the first coil and inside the second coil, and a second magnetic device 192 is disposed outside the second coil and inside the third coil. The three coils and the two magnetic devices 113, 192 may be concentric.

The medium diameter D, defined by the distance from the center of the magnetic device 113 to a midpoint M1 defined half way between the outer edge 202 and the inner edge 204, may be based on the size of the substrate and the configuration of the coils. One or more openings 203 may be formed in the magnetic device 113 for attaching the magnetic device 113 to the one or more supports 168.

FIG. 2B is a plan view of the magnetic device 113 according to another embodiment. As shown in FIG. 2B, the magnetic device 113 may include a plurality of magnets 206. Each magnet 206 of the plurality of magnets 206 may be a permanent magnet, electromagnet, electro-permanent magnet, or any other suitable magnet. In one embodiment, each magnet 206 is a rare earth magnet. The plurality of magnets 206 may be encapsulated with nickel or stainless steel. Each magnet 206 may include an outer pole 208 and an inner pole 210. In one embodiment, the outer pole 208 of each magnet 206 is the north pole and the inner pole 210 of each magnet 206 is the south pole. In another embodiment, the outer pole 208 of each magnet 206 is the south pole and the inner pole 210 of each magnet 206 is the north pole. The medium diameter D, defined by the distance from the center C to a midpoint M2 between the outer pole 208 and the inner pole 210, may be based on the size of the substrate, the configuration of the coils, and/or the region of power deposition between the coils. In one embodiment, the magnets 206 are co-planar. In other embodiments, some magnets are disposed closer to the chamber lid 120 than others. In embodiments wherein the magnets 206 are electromagnets, the flux produced by the magnets may be adjusted higher or lower to produce a desired processing result. Additionally, magnets 206 (electromagnets or permanent) disposed on one side of the magnetic device 113 may be set to produce a flux different than magnets 206 (electromagnets or permanent) to produce a desired processing result.

The plurality of the magnets 206 may be supported by a case 212, and the case 212 may be made of a dielectric material that has a melting point of greater than 120 degrees Celsius. The case 212 may have an annular shape. The case 212 may include a top and a bottom, and the top and the bottom may be adhered or otherwise fastened (screws, tape, etc.). The case 212 may include a plurality of trays and each tray may hold a magnet 206. The case 212 may have an outer edge 209 and an inner edge 211. The width of the case 212, defined between the outer edge 209 and the inner edge 211, may be constant, and may be smaller than, the same as, or greater than the axial length of the magnet 206. If the width of the case 212 is greater than the axial length of the magnet 206, spacers may be used to secure the magnets 206. In one embodiment, the magnets 206 may be placed in individual recesses that have a width that is less than the axial length of the magnet 206. One or more openings 205 may be formed in the case 212 for attaching the magnetic device 113 to the one or more supports 168.

The number of magnets 206 may be based on the cross sectional area of the poles 208, 210. In one embodiment, the cross sectional area of the poles 208, 210 of each magnet 206 is circular (shown in FIG. 2C). For magnets having a relatively larger cross sectional area, the number of magnets may be less than the magnet having a relatively smaller cross sectional area. The number of magnets 206 may range from 12 to 200, such as from 100 to 200. In one embodiment, the number of magnets 206 ranges from 12 to 48. In one embodiment, the magnetic device 113 includes 12 cylindrical NdFeB magnets 206, and each magnet 206 has a cross sectional area having a ¾ of an inch diameter. The surface magnetic field of the magnetic device 113 including 12 magnets 206 has a field strength of about 5903 gauss at any point on the surface. Each of the 12 magnets 206 is encapsulated with nickel. In another embodiment, the magnetic device 113 includes 48 NdFeB magnets 206, and each magnet 206 has a cross sectional area having a ⅜ of an inch diameter. The surface magnetic field of the magnetic device 113 including 48 magnets 206 has a field strength of about 6403 gauss at any point on the surface. Each of the 48 magnets 206 is encapsulated with nickel. The magnets 206 may be evenly spaced apart.

Referring back to FIG. 1, during operation, the effect of the magnetic fields generated by the magnetic device 113 and/or the magnet 170 on the plasma formed inside the processing volume 112 may be adjusted by changing the distance A shown in FIG. 1. When the distance A is the smallest, the effect of the magnetic fields may be the strongest, and as the distance A becomes larger, the effect of the magnetic fields is diminished. At a certain distance A, the effect of the magnetic fields on the plasma formed inside the processing volume 112 is eliminated. To reduce the distance A at which the effect of the magnetic fields on the plasma vanishes, a plurality of "thief" magnets 180 may be placed on the cap 166 to "steal" the magnetic flux from the magnetic device 113. The "thief" magnets 180 may be disposed outside of the cap 166, as shown in FIG. 1, or may be disposed inside of the cap 166. Another method to eliminate the effect of the magnetic fields on the plasma formed inside the processing volume 112 is to rotate each magnet 206 so one of poles 208, 210 of one magnet 206 is facing the other pole of poles 208, 210 of an adjacent magnet 206, such as the "train" configuration shown in FIG. 2C. Such an embodiment may feature an actuator coupled to the magnets to perform the rotation. One actuator may be coupled to each magnet, or the magnets may be grouped together and an actuator assembly may rotate all the magnets in a group under the rotational force of one actuator. The actuator or actuators are appropriately powered to overcome any rotational resistance of the magnets.

While the foregoing is directed to embodiments of the present disclosure, other and further embodiments may be devised without departing from the basic scope thereof, and the scope thereof is determined by the claims that follow.

The invention claimed is:

1. A plasma processing apparatus, comprising:
  a plasma source assembly, wherein the plasma source assembly comprises:
    a first coil;
    a second coil surrounding the first coil, the first coil and the second coil being electrically coupled in parallel;
    a first magnetic device disposed outside the first coil and inside the second coil;
    a third coil surrounding the second and first coils;
    a second magnetic device disposed outside of the second coil and inside of the third coil; and
    a permanent magnet distinct from the first and second magnetic devices disposed at a center of the first and second coils.

2. The plasma processing apparatus of claim 1, wherein the first magnetic device comprises a permanent magnet.

3. The plasma processing apparatus of claim 2, wherein the first magnetic device is an annular piece of material.

4. The plasma processing apparatus of claim 1, wherein the first magnetic device comprises a plurality of permanent magnets.

5. The plasma processing apparatus of claim 4, wherein the plurality of permanent magnets include 12 to 200 permanent magnets.

6. The plasma processing apparatus of claim 4, further comprising a case supporting the plurality of permanent magnets.

7. The plasma processing apparatus of claim 6, wherein the case is annular.

8. A plasma processing apparatus, comprising:
  a process chamber, wherein the process chamber comprises:
    a chamber body;
    a chamber lid; and
    a plasma source assembly disposed over the process chamber, wherein the plasma source assembly comprises:
      a first coil;
      a second coil surrounding the first coil, wherein the first and second coils define an annular space between the first and second coils, the first coil and the second coil being electrically coupled in parallel;
      a first magnetic device disposed in the annular space;
      a third coil surrounding the second and first coils;
      a second magnetic device disposed outside of the second coil and inside of the third coil; and
      a permanent magnet distinct from the first and second magnetic devices disposed over the chamber lid, wherein the permanent magnet is disposed at a center of the first and second coils.

9. The plasma processing apparatus of claim 8, wherein the magnetic device is an annular piece of permanent magnet.

10. The plasma processing apparatus of claim 8, wherein the magnetic device comprises a plurality of permanent magnets.

11. The plasma processing apparatus of claim 10, wherein the plurality of permanent magnets include 12 to 200 permanent magnets.

12. The plasma processing apparatus of claim 10, further comprising a case supporting the plurality of permanent magnets.

13. The plasma processing apparatus of claim 12, wherein the case is annular.

14. The plasma processing apparatus of claim 8, further comprising a cap enclosing the plasma source assembly.

15. A method, comprising:
  delivering a process gas into a processing volume of a process chamber including a chamber lid and a plasma source assembly disposed over the chamber lid, wherein the plasma source assembly comprises at least two coils and a magnetic device disposed between the two coils, and the magnetic device is a distance away from the chamber lid;
  inductively coupling an RF power to the process gas from an RF power source via the at least two coils;
  forming a plasma in the processing volume from the process gas using the RF power;
  creating a magnetic field in the processing volume using the magnetic device; and
  adjusting a strength of the magnetic field.

16. The method of claim 15, wherein the magnetic field is adjusted by changing the distance between the magnetic device and the chamber lid.

17. The method of claim 16, further comprising a magnet disposed on the chamber lid at a center of the at least two coils, wherein the magnetic field is adjusted by changing a distance between the magnet and the chamber lid.

* * * * *